United States Patent [19]

Benjamin et al.

[11] Patent Number: 4,533,783
[45] Date of Patent: Aug. 6, 1985

[54] AC SOLAR CELL WITH ALTERNATELY GENERATED PN JUNCTIONS

[75] Inventors: James A. Benjamin, Waukesha, Wis.; Robert W. Lade, Fort Myers, Fla.; Herman P. Schutten, Milwaukee, Wis.

[73] Assignee: Eaton Corporation, Cleveland, Ohio

[21] Appl. No.: 618,440

[22] Filed: Jun. 8, 1984

[51] Int. Cl.$^3$ .............................................. H01L 31/06
[52] U.S. Cl. ................................. 136/249; 136/255; 136/293; 357/30
[58] Field of Search ........ 136/255, 291, 293, 249 MS; 357/30

[56] References Cited

U.S. PATENT DOCUMENTS 4,081,820  3/1978  Chitre .................................. 357/30
4,217,633  8/1980  Evans, Jr. ........................... 363/27

Primary Examiner—Aaron Weisstuch
Attorney, Agent, or Firm—Andrus, Sceales, Starke & Sawall

[57] ABSTRACT

A solar cell (2) is provided for generating alternating current to drive an external load (18) in response to light radiation. A central region (4) of given conductivity type is disposed between said first and second regions (6) and (8) of intrinsic or invertable semiconductor material applied with AC gate drive (12). The light-generated hole-electron pairs alternately diffuse in opposite directions across the alternately induced pn junctions between the central region (4) and the first and second converted conductivity type intrinsic or invertable regions (6) and (8) to set up alternating potential gradients in opposite directions.

10 Claims, 4 Drawing Figures

AC SOLAR CELL WITH ALTERNATELY GENERATED PN JUNCTIONS

BACKGROUND AND SUMMARY

The invention provides a solar cell generating alternating current in response to light. A central region of given conductivity type semiconductor material is disposed between first and second regions of intrinsic or invertable semiconductor material. AC gate driver means alternates the induced polarity type in the intrinsic or invertable regions such that hole-electron pairs generated by light radiation diffuse alternately and in opposite directions between the alternately generated pn junctions between the central region and the respective first and second intrinsic or invertable regions, thus generating alternating current.

DETAILED DESCRIPTION

Figure 1:
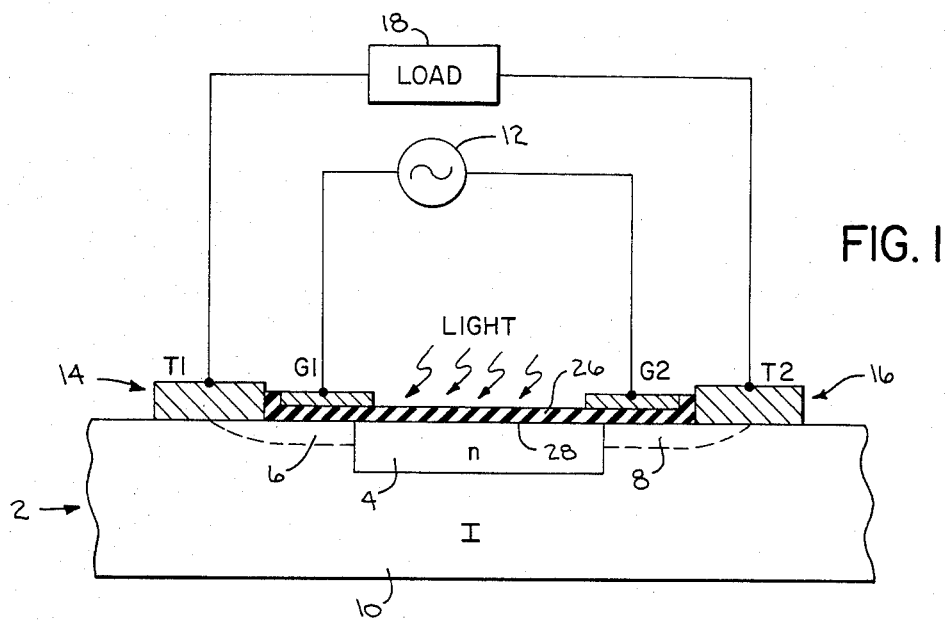
FIG. 1 is a schematic substrate circuit diagram illustrating an AC solar cell constructed in accordance with the invention.

There is shown in FIG. 1 an AC solar cell 2 having a central region 4 of given conductivity type semiconductor material, such as n type, between first and second regions 6 and 8 of intrinsic or invertable semiconductor material. Regions 6 and 8 may be separate, or part of a common substrate layer 10. First and second gate electrodes $G_1$ and $G_2$ are provided for respective first and second intrinsic or invertable regions 6 and 8. AC gate driver means 12 is provided for applying alternating polarity gate potential to the first and second gate electrodes. During the first half cycle, first intrinsic or invertable region 6 is converted to one conductivity type and second intrinsic or invertable region 8 is converted to the opposite conductivity type. During the second half cycle, first intrinsic or invertable region 6 is converted to the opposite conductivity type and second intrinsic or invertable region 8 is converted to the one conductivity type.

First and second terminal connection means 14 and 16 are provided for the first and second intrinsic or invertable regions 6 and 8. During the first half cycle, hole-electron pairs, generated by light radiation impinging the top surface of cell 2, diffuse across the pn junction between the central region 4 and one of the converted intrinsic or invertable regions 6 and 8 to set up a potential gradient which drives current in one direction between first and second terminal connection means 14 and 16. During the second half cycle, hole-electron pairs generated by light radiation diffuse across the pn junction between central region 4 and the other of converted intrinsic or invertable regions 6 and 8 to set up a potential gradient which drives current in the opposite direction between first and second terminal connection means 14 and 16. There is thus generated alternating current between first and second terminal connection means 14 and 16 for driving an external load 18.

Figure 2:
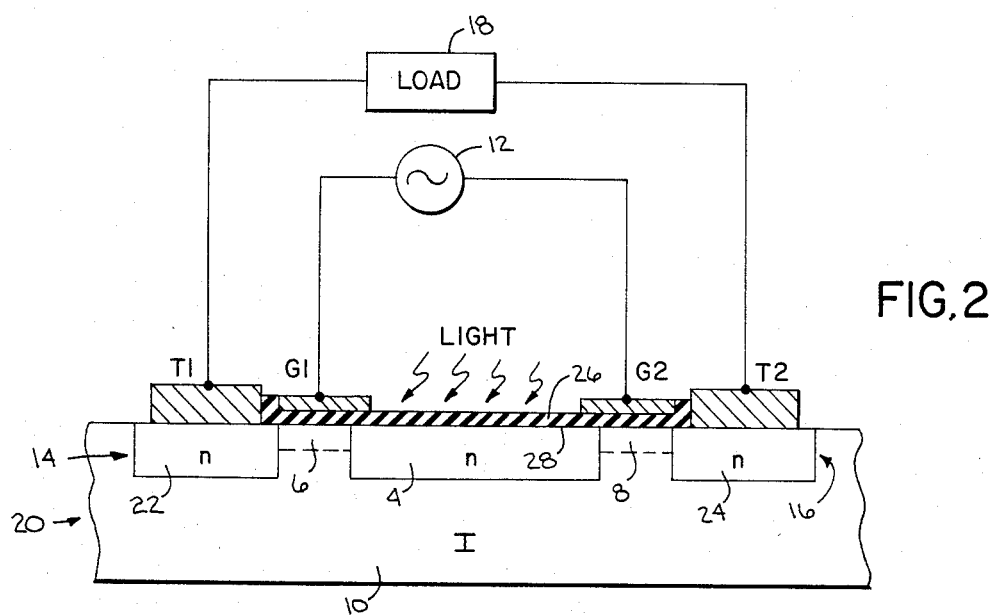
FIG. 2 is a schematic substrate circuit diagram showing an alternate embodiment of FIG. 1.

FIG. 2 shows an alternate embodiment, and like reference numerals are used where appropriate to facilitate clarity. In cell 20 of FIG. 2, first and second terminal connection means 14 and 16 include regions 22 and 24 of degenerately doped semiconductor material each forming a nonblocking junction with its respective intrinsic or invertable region 6 or 8 regardless of whether the latter is converted to p or n type. First and second terminal connection means 14 and 16 further include respective terminals $T_1$ and $T_2$ contacting respective degenerate regions 22 and 24. Degenerate regions 22 and 24 are the same conductivity type as central region 4, such as n type.

In preferred form, in both embodiments, first and second intrinsic regions 6 and 8 are part of a common substrate 10 having a tub 4 of given conductivity type semiconductor material formed therein to provide the central region. First and second gate electrodes $G_1$ and $G_2$ are preferably proximate and insulated from respective first and second intrinsic or invertable regions 6 and 8, though the gate electrodes may contact the intrinsic or invertable regions if desired. In preferred form, gate electrodes $G_1$ and $G_2$ are insulated from intrinsic or invertable regions 6 and 8 by transparent insulation material 26 extending across central region 4 along the top surface of the cell. Central region 4 and first and second intrinsic or invertable regions 6 and 8 are coplanar along top major surface 28 of the cell. First and second intrinsic or invertable regions 6 and 8 are formed by common substrate 10 extending upwardly on left and right sides of central region 4 to top major surface 28.

In FIG. 2, a first terminal connection means 14 comprises tub region 22 of degenerately doped semiconductor material formed in substrate 10 from top major surface 28 and spaced leftwardly from central region 4 by first intrinsic or invertable region 6 of substrate 10 extending upwardly therebetween to top major surface 28. First degenerate tub region 22 forms a nonblocking junction with first intrinsic or invertable region 6 regardless of whether the latter is converted to p or n type by first gate electrode $G_1$ during the respective half cycle of gate driver means 12. First terminal connection means 14 further comprises first terminal $T_1$ contacting first degenerate tub region 22. Second terminal connection means 16 comprises second tub region 24 of degenerately doped semiconductor material formed in substrate 10 from top major surface 28 and spaced rightwardly from central region 4 by second intrinsic or invertable region 8 of substrate 10 extending upwardly therebetween to top major surface 28. Second degenerate tub region 24 forms a nonblocking junction with second intrinsic or invertable region 8 regardless of whether the latter is converted to p or n type by second gate electrode $G_2$ during the respective half cycle of gate driver means 12. Second terminal connection means 16 further comprises second terminal $T_2$ contacting second degenerate tub region 24.

Figure 3:
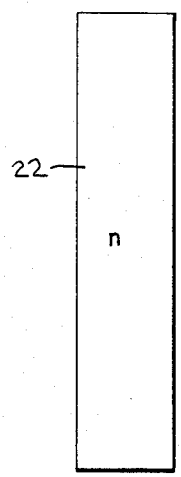
FIG. 3 is a top view of a portion of FIG. 2.
Figure 4:
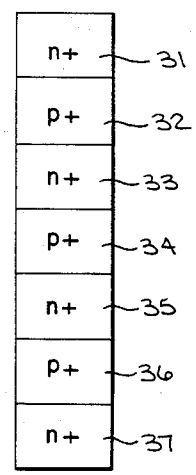
FIG. 4 is a view like FIG. 3, showing an alternate embodiment.

FIG. 3 shows a partial top view of n region 22 of FIG. 2, illustrating that region 22 extends laterally in the form of a bar or the like. FIG. 4 shows an alternate embodiment wherein bar region 22 is replaced by a plurality of alternating n+ and p+ regions such as 31-37. When using the structure in FIG. 4, region 6 of FIG. 2 need not be as heavily accumulated or depleted, which is otherwise desirable for providing the degenerate diode between regions 22 and 6, Region 10 in FIGS. 1 and 2 can be a polycrystalline layer over an insulating substrate, or a single crystal layer over an insulating substrate. Region 10 may be p type if invertable in areas 6 and 8 to n type. If region 10 in FIG. 1 is p type, it may be desirable to provide n regions such as 22 and 24 under main terminal metallizations $T_1$ and $T_2$ in FIG. 1. If region 10 in FIG. 2 is p type, the alternative of FIG. 4 is not used.

It is recognized that various modifications are possible within the scope of the appended claims.

We claim:

1. An AC solar cell comprising:
   a central region of given conductivity type semiconductor material between first and second regions of intrinsic or invertable semiconductor material;
   first and second gate electrodes for respective said first and second intrinsic or invertable regions, and AC gate driver means for applying alternating polarity gate potential to said first and second gate electrodes, such that during the first half cycle said first intrinsic or invertable region is converted to one conductivity type and said second intrinsic or invertable region is converted to the opposite conductivity type, and such that during the second half cycle said first intrinsic or invertable region is converted to said opposite conductivity type and said second intrinsic or invertable region is converted to said one conductivity type;
   first and second terminal connection means for respective said first and second intrinsic or invertable regions, such that during the first half cycle hole-electron pairs generated by light radiation diffuse across the pn junction between said central region and one of said converted intrinsic or invertable regions to set up a potential gradient which drives current in one direction between said first and second terminal connection means, and such that during the second half cycle hole-electron pairs generated by light radiation diffuse across the pn junction between said central region and the other of said converted intrinsic or invertable regions to set up a potential gradient which drives current in the opposite direction between said first and second terminal connection means, to generate alternating current between said first and second terminal connection means.

2. The invention according to claim 1 wherein each of said first and second terminal connection means includes a region of degenerately doped semiconductor material forming a nonblocking junction with its respective intrinsic or invertable region regardless of whether the latter is converted to p or n type, and a terminal contacting said degenerate region.

3. The invention according to claim 2 wherein each said degenerate region is the same conductivity type as said central region.

4. The invention according to claim 1 wherein each of said first and second terminal connection means includes a bar of semiconductor material comprising a plurality of alternating conductivity type regions; each bar contacting its respective intrinsic or invertable region, and a terminal contacting each of said alternating conductivity type regions.

5. The invention according to claim 1 wherein said first and second intrinsic or invertable regions are part of a common substrate having a tub of given conductivity type semiconductor material formed therein to provide said central region.

6. The invention according to claim 1 wherein said first and second gate electrodes are proximate and insulated from respective said first and second intrinsic or invertable regions.

7. The invention according to claim 6 wherein said gate electrodes are insulated from said intrinsic or invertable regions by transparent insulation material extending across said central region.

8. The invention according to claim 6 wherein said central region and said first and second intrinsic or invertable regions are coplanar along a top major surface of said cell, and wherein said first and second intrinsic or invertable regions are formed by a common substrate extending upwardly on left and right sides of said central region to said top major surface.

9. The invention according to claim 8 wherein:
   said first terminal connection means comprises:
   a first tub region of degenerately doped semiconductor material formed in said substrate from said top major surface and spaced leftwardly from said central region by said first intrinsic or invertable region of said substrate extending upwardly therebetween to said top major surface, said first degenerate tub region forming a nonblocking junction with said first intrinsic or invertable region regardless of whether the latter is converted to p or n type by said first gate electrode during the respective half cycle of said gate driver means; and
   a first terminal contacting said first degenerate tub region; and
   said second terminal connection means comprises:
   a second tub region of degenerately doped semiconductor material formed in said substrate from said top major surface and spaced rightwardly from said central region by said second intrinsic or invertable region of said substrate extending upwardly therebetween to said top major surface, said second degenerate tub region forming a nonblocking junction with said second intrinsic or invertable region regardless of whether the latter is converted to p or n type by said second gate electrode during the respective half cycle of said gate driver means; and
   a second terminal contacting said second degenerate tub region.

10. The invention according to claim 8 wherein:
    said first terminal connection means comprises:
    a first bar of semiconductor material extending laterally in said substrate across said top major surface and spaced leftwardly from said central region by said first intrinsic or invertable region of said substrate extending upwardly therebetween to said top major surface, said first bar comprising a plurality of alternating conductivity type regions each contacting said first intrinsic or invertable region; and
    a first terminal contacting said alternating conductivity type regions of said first bar; and
    said second terminal connection means comprises:
    a second bar of semiconductor material in said substrate extending laterally across said top major surface and spaced rightwardly from said central region by said second intrinsic or invertable region of said substrate extending upwardly therebetween to said top major surface, said second bar comprising a plurality of alternating conductivity type regions each contacting said second intrinsic or invertable region; and
    a second terminal contacting said alternating conductivity type regions of said second bar.

* * * * *